(12) United States Patent
Lee et al.

(10) Patent No.: US 11,043,923 B2
(45) Date of Patent: Jun. 22, 2021

(54) BIAS CIRCUIT AND AMPLIFYING DEVICE HAVING TEMPERATURE COMPENSATION FUNCTION

(71) Applicant: Samsung Electro-Mechanics Co., Ltd., Suwon-si (KR)

(72) Inventors: Geun Yong Lee, Suwon-si (KR); Seong Geun Kim, Suwon-si (KR); Hyeon Seok Hwang, Suwon-si (KR); Seung Chui Pyo, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 97 days.

(21) Appl. No.: 16/513,823

(22) Filed: Jul. 17, 2019

(65) Prior Publication Data

US 2020/0304077 A1    Sep. 24, 2020

(30) Foreign Application Priority Data

Mar. 19, 2019  (KR) .......................... 10-2019-0031405

(51) Int. Cl.
| | | |
|---|---|---|
| *H03F 3/04* | (2006.01) | |
| *H03F 1/30* | (2006.01) | |
| *H03F 1/32* | (2006.01) | |
| *H04W 84/04* | (2009.01) | |

(52) U.S. Cl.
CPC ............... *H03F 1/302* (2013.01); *H03F 1/32* (2013.01); *H03F 3/04* (2013.01); *H03F 2200/447* (2013.01); *H04W 84/042* (2013.01)

(58) Field of Classification Search
CPC ....... H03F 1/302; H03F 3/04; H03F 2200/447

USPC ......................................... 330/296, 285, 289
See application file for complete search history.

(56) References Cited

U.S. PATENT DOCUMENTS 8,791,761 B2 *    7/2014  Ding ......................... H03F 3/21
                                                  330/296
2014/0240049 A1    8/2014  Won et al.

FOREIGN PATENT DOCUMENTS

JP        2007-243873 A    9/2007
KR   10-2014-0107965 A    9/2014

* cited by examiner

*Primary Examiner* — Khanh V Nguyen
*Assistant Examiner* — Khiem D Nguyen
(74) *Attorney, Agent, or Firm* — NSIP Law

(57) ABSTRACT

A bias circuit includes a bias current circuit and a temperature compensation circuit. The bias current circuit includes a first resistor and a first transistor, in a first current path connected between a current terminal of a reference current and a ground, and connected to each other in series, and a second transistor in a second current path connected between the current terminal and the ground, and having a base connected to a collector of the first transistor. The temperature compensation circuit includes a second resistor in the second current path, and connected between an emitter of the second transistor and a base of the first transistor and having a first thermal coefficient, and a third resistor included in the second current path, and connected between the base of the first transistor and the ground and having a second thermal coefficient, different from the first thermal coefficient.

17 Claims, 3 Drawing Sheets

BIAS CIRCUIT AND AMPLIFYING DEVICE HAVING TEMPERATURE COMPENSATION FUNCTION

CROSS-REFERENCE TO RELATED APPLICATION(S)

This application claims benefit under 35 USC 119(a) of Korean Patent Application No. 10-2019-0031405 filed on Mar. 19, 2019 in the Korean Intellectual Property Office, the entire disclosure of which is incorporated herein by reference for all purposes.

BACKGROUND

1. Field

The following description relates to a bias circuit having a temperature compensation function and an amplifying device.

2. Description of Related Art

Generally, a service provided for 5th generation (5G) communications, or a band below 6 GHz (sub-6), requires a transfer data rate of up to 20 Gbps. In order to efficiently support the high data transfer rate described above, a new channel coding scheme is introduced along with a modulation scheme such as 16 QAM (Quadrature Amplitude Modulation), 64 QAM, and 256 QAM.

In addition, in the case of Long Term Evolution (LTE), the bandwidth of a system is limited to 20 MHz. However, in the sub-6 standard, channel bandwidth is supported up to 400 MHz, thus emphasizing the importance of the linearity of the communications system. For example, Error Vector Magnitude (EVM) may be used as a linearity index. Although the requirements vary according to the specification, a low EVM is typically required.

As described above, in order to satisfy the linearity index, which is gradually increased, the amplifying device may be desired to have a temperature compensation function so as to have characteristics insensitive to a change in temperatures.

Typical amplifying devices may have problems with temperature changes during operations, the current gain and gain flatness may change based on the change in temperatures, the gain of the amplifying device may change, and an EVM function may change, thereby degrading the linearity characteristics.

In addition, in typical amplifying devices, an amplifying device may include a temperature compensation function. For example, when typical amplifying devices include a temperature compensation circuit that is separate from a bias circuit, there may be a disadvantage in that production costs may be increased.

As another example, in typical amplifying devices, a bias circuit itself may include a temperature compensation function. In this case, the bias circuit having a temperature compensation function may have a complex circuit structure, including a relatively large number of components. Thus, due to such a complex circuit structure, there may be problems designing and manufacturing the circuit at low cost, and the temperature compensation function may be limited, for example, a lowered temperature compensation function.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a bias circuit includes a bias current circuit and a temperature compensation circuit. The bias current circuit includes a first resistor and a first transistor, in a first current path connected between a current terminal of a reference current and a ground, and connected to each other in series, and a second transistor in a second current path connected between the current terminal and the ground, and having a base connected to a collector of the first transistor. The temperature compensation circuit includes a second resistor in the second current path, and connected between an emitter of the second transistor and a base of the first transistor and having a first thermal coefficient, and a third resistor included in the second current path, and connected between the base of the first transistor and the ground and having a second thermal coefficient, different from the first thermal coefficient.

The bias circuit may further include a bias output circuit having a third transistor connected between a power supply voltage terminal and a base node of an amplifier circuit, and have a base connected to the base of the second transistor.

The first resistor may have a zero thermal coefficient, and the first thermal coefficient may be a negative thermal coefficient.

The second thermal coefficient may be a positive thermal coefficient.

The first resistor may be a zero thermal coefficient, the first thermal coefficient may be a negative thermal coefficient, and the second thermal coefficient may be a positive thermal coefficient.

Upon an ambient temperature rising, a resistance value of the third resistor may increase and a base current of the first transistor increase.

Upon an ambient temperature rising, a resistance value of the third resistor may increase, a base current of the first transistor may increase, and a resistance value of the second resistor may decrease.

The first transistor may increase a collector-emitter current of the first transistor based on an increase in the base current of the first transistor, to reduce a base current of the third transistor, and to reduce a base bias current, a collector-emitter current of the third transistor.

In another general aspect, an amplifying device includes a bias circuit and an amplifier circuit. The bias circuit is configured to supply a base bias voltage. The amplifier circuit is configured to receive the base bias voltage. The bias circuit includes a bias current circuit and a temperature compensation circuit. The bias current circuit includes a first resistor and a first transistor, in a first current path connected between a current terminal of a reference current and a ground, and connected to each other in series, and a second transistor in a second current path connected between the current terminal and the ground, and having a base connected to a collector of the first transistor. The temperature compensation circuit includes a second resistor in the second current path, and connected between an emitter of the second transistor and the base of the first transistor and having a first thermal coefficient, and a third resistor included in the second current path, connected between the base of the first transistor and the ground and having a second thermal coefficient, different from the first thermal coefficient.

The bias circuit may further include a bias output circuit having a third transistor connected between a power supply voltage terminal and a base node of an amplifier circuit, and have a base connected to the base of the second transistor.

The first resistor may have a zero thermal coefficient, and the first thermal coefficient may be a negative thermal coefficient.

The second thermal coefficient may be a positive thermal coefficient.

The first resistor may have a zero thermal coefficient, the first thermal coefficient may be a negative thermal coefficient, and the second thermal coefficient may be a positive thermal coefficient.

Upon an ambient temperature rising, a resistance value of the third resistor may increase and a base current of the first transistor may increase.

Upon an ambient temperature rising, a resistance value of the third resistor may increase, a base current of the first transistor may increase, and a resistance value of the second resistor may decrease.

The first transistor may increase a collector-emitter current of the first transistor based on an increase in the base current of the first transistor, to reduce a base current of the third transistor, and to reduce a base bias current, a collector-emitter current of the third transistor.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
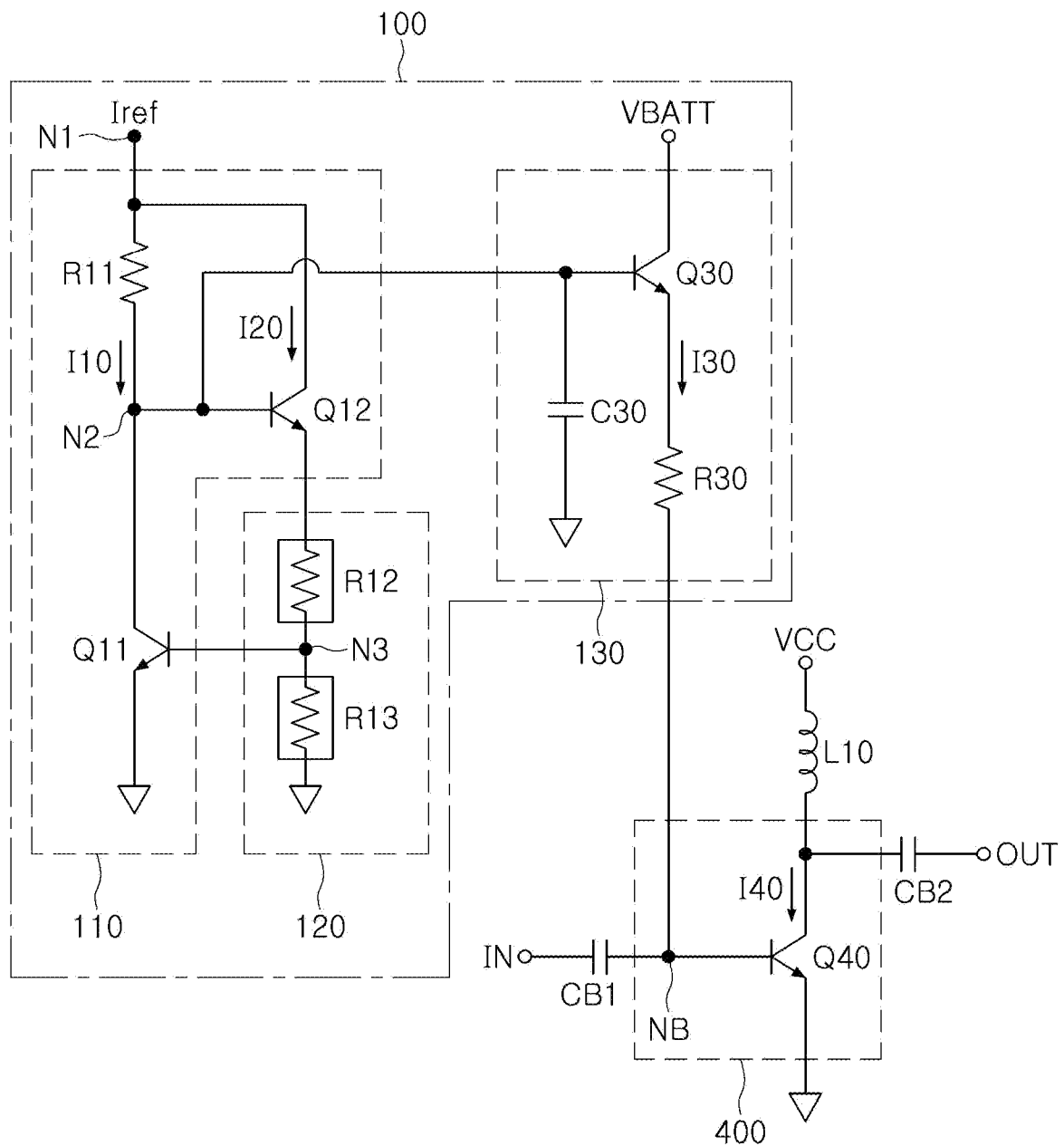
FIG. 1 is a view of an example of an amplifying device.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a view of an example of an amplifying device.

Referring to FIG. 1, an amplifying device 10 may include a bias circuit 100 and an amplifier circuit 400.

The bias circuit 100 may supply a base bias voltage Vbb to the amplifier circuit 400.

The amplifier circuit 400 receives the base bias voltage Vbb, and may include a base connected to an input terminal IN via a first DC blocking capacitor CB1, a collector connected to an output terminal OUT via a second DC blocking capacitor CB2, and an amplifying transistor Q40 connected to ground.

The bias circuit 100 includes a bias current circuit 110, a temperature compensation circuit 120, and a bias output circuit 130.

The bias current circuit 110 may include a first resistor R11, a first transistor Q11, and a second transistor Q12.

The first resistor R11 and the first transistor Q11 may be included in a first current path connected between a current terminal N1 of a reference current Iref and ground, and may be connected to each other in series. For example, the first resistor R11 may be connected between the current terminal N1 and a collector of the first transistor Q11. The first transistor Q11 may include a collector connected to the first resistor R11, a base connected to the temperature compensation circuit 120, and an emitter connected to ground.

The second transistor Q12 is included in a second current path connected between the current terminal N1 and the ground, and may include a collector connected to the current terminal N1, a base connected to the collector of the first transistor Q11, and an emitter connected to the temperature compensation circuit 120.

The temperature compensation circuit 120 may include a second resistor R12 and a third resistor R13.

The second resistor R12 may be included in the second current path, may be connected between the emitter of the second transistor Q12 and the base of the first transistor Q11, and may be a resistor having a first thermal coefficient.

The third resistor R13 may be included in the second current path, may be connected between a base of the first transistor Q11 and ground, and may be a resistor having a second thermal coefficient, different from the first thermal coefficient.

Further, the bias output circuit 130 may include a third transistor Q30. The third transistor Q30 may include a collector connected to a terminal of the power supply voltage VBATT, an emitter connected to the base node NB of the amplifier circuit 400 via the resistor R30, and a base connected to the base of the second transistor Q12.

For example, the first resistor R11 may be a resistor having a zero thermal coefficient (ZTC), the second resistor R12 may be a resistor having a negative thermal coefficient (NTC) as the first thermal coefficient, and the third resistor R13 may be a resistor having a positive thermal coefficient (PTC) as the second thermal coefficient.

Each of the first transistor Q11, the second transistor Q12, the third transistor Q30, and the amplifying transistor Q40 may be a bipolar junction transistor (BJT).

For each drawing of the present disclosure, unnecessary redundant explanations may be omitted for components having the same reference numerals and the same function, and differences for each drawing will be explained.

Figure 2:
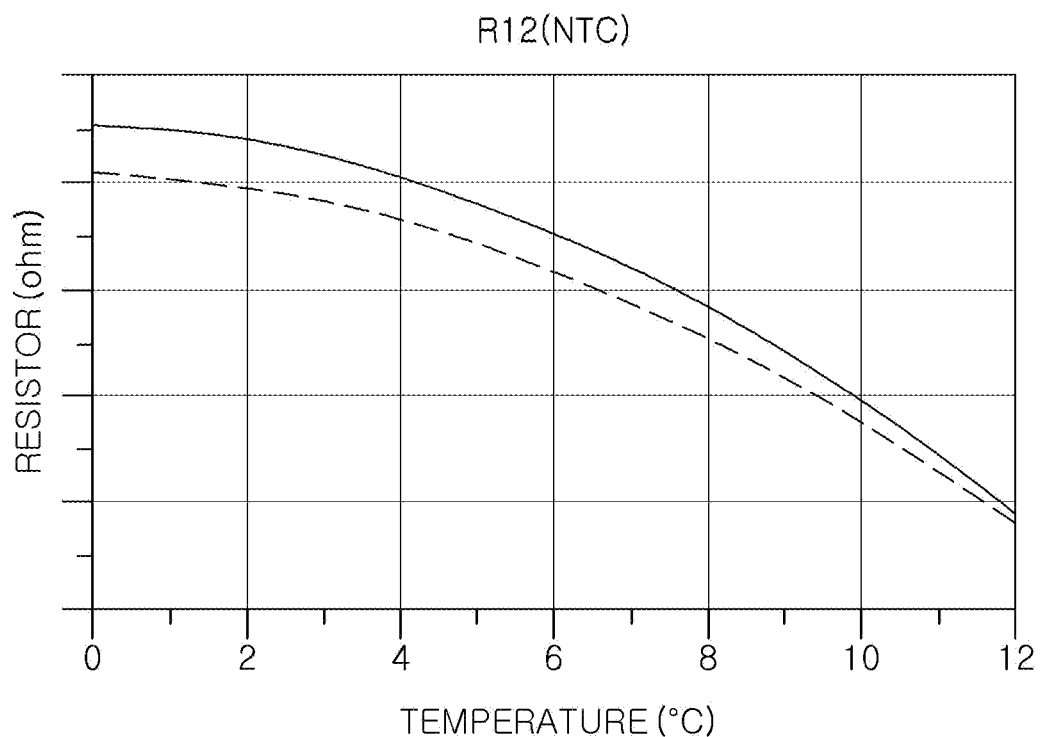
FIG. 2 is a graph illustrating characteristics of an example of a second resistor having a negative thermal coefficient.

FIG. 2 is a graph illustrating characteristics of an example of a second resistor having a negative thermal coefficient.

Referring to FIG. 2, the second resistor R12 is a resistor having a negative thermal coefficient (NTC) and, as can be seen depicted, the resistance value of the second resistor R12 decreases as an ambient temperature rises.

Figure 3:
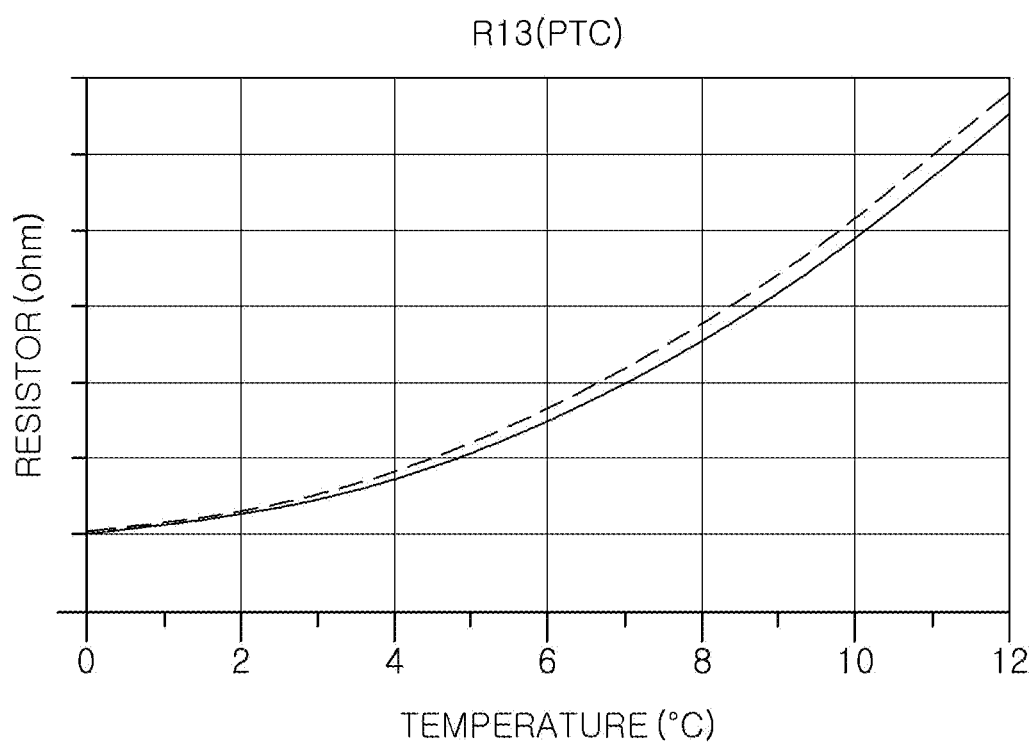
FIG. 3 is a graph illustrating characteristics of n example of a third resistor having a positive thermal coefficient.

FIG. 3 is a graph illustrating characteristics of an example of a third resistor having a positive thermal coefficient.

Referring to FIG. 3, the third resistor R13 is a resistor having a positive thermal coefficient (PTC) and, as can be seen depicted, the resistance value of the third resistor R13 increases as an ambient temperature rises.

Figure 4:
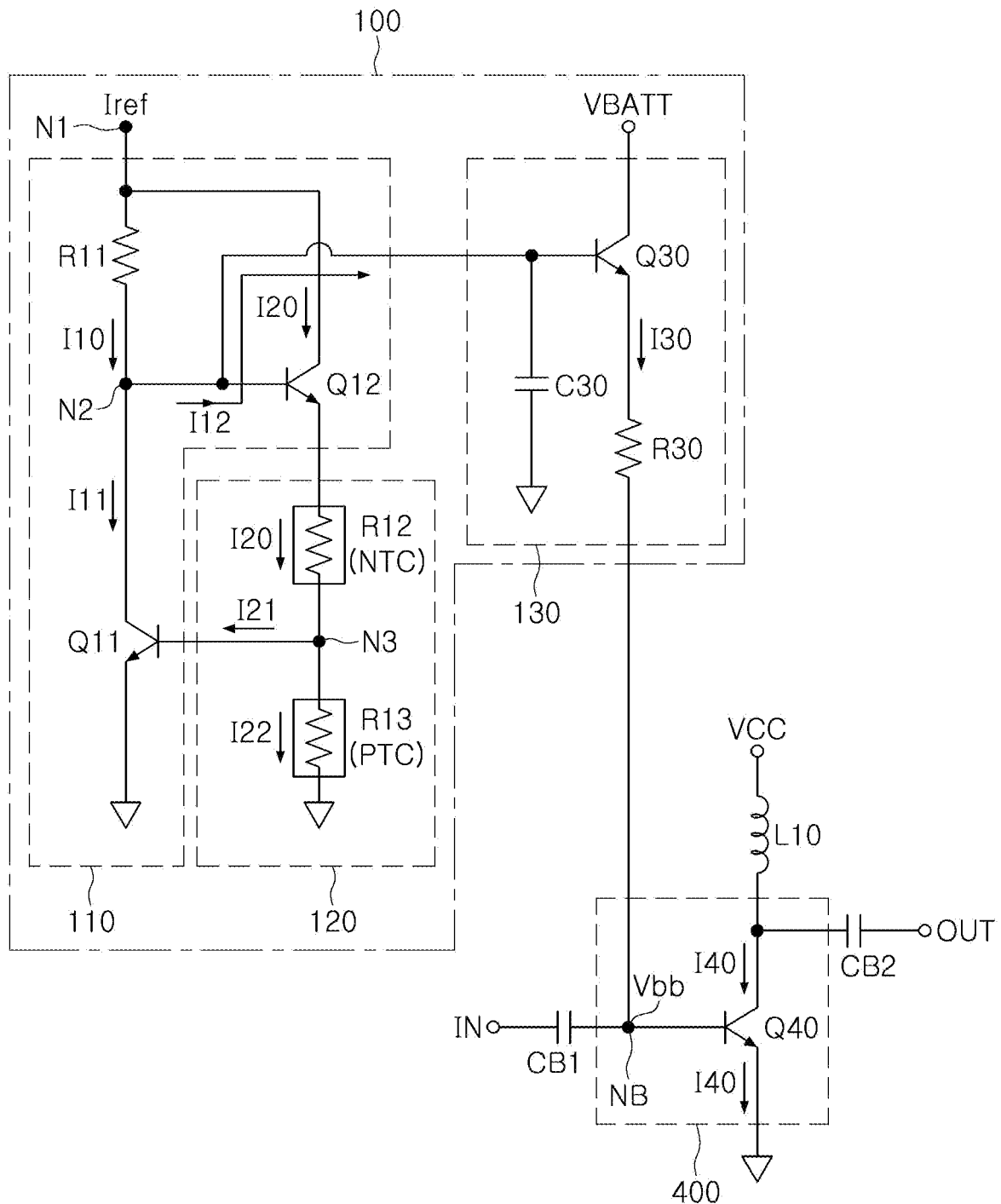
FIG. 4 is a view illustrating an operation of the amplifying device of FIG. 1.

FIG. 4 is a view illustrating an operation of the amplifying device of FIG. 1.

Referring to FIG. 4, for example, when an ambient temperature of the amplifying device of FIG. 1 rises, an operating point of the amplifying transistor Q40 of the amplifier circuit 400 is lowered according to characteristics of a bipolar junction transistor BJT. Accordingly, a collector-emitter current I40, flowing through the amplifying transistor Q40, may be high.

As described above, as the ambient temperature rises, the collector-emitter current I40 of the amplifying transistor Q40 is increased. In this regard, the collector-emitter current I40 of the amplifying transistor Q40 is required to be compensated, and a compensation process will be described.

For example, when the ambient temperature of the amplifying device of FIG. 1 is raised, the second resistor R12 is a resistor having a negative thermal coefficient (NTC), and the third resistor R13 is a resistor having a positive thermal coefficient (PTC), a resistance value of the second resistor R12 is decreased and a resistance value of the third resistor R13 is increased.

A current I20, flowing through a collector-emitter of the second transistor Q12 included in the second current path, is divided into a base current I21 flowing to the base of the first transistor Q11 and ground current I22 flowing to ground through the third resistor R13 at a connection node N3 between the second resistor R12 and the third resistor R13.

In this example, when a resistance value of the third resistor R13 is increased, the ground current I22 is decreased, and the base current I21 of the first transistor Q11 is increased.

Then, the current I10, flowing through the first resistor R11 included in the first current path, is divided into a base current I12 flowing to a base of the second transistor Q12 and a ground current I11 flowing to ground through a collector-emitter of the first transistor Q11 at a connection node N2 between the first resistor R11 and a collector of the first transistor Q11.

As described above, when the base current I21 of the first transistor Q11 is increased, a ground current I11 flowing to ground through a collector-emitter of the first transistor Q11 is increased, so a base current I12 of the second transistor Q12 may be decreased.

Then, the base current I12 of the second transistor Q12 is supplied to the base of the third transistor Q30, which decreases the base current I12 of the second transistor Q12. In this example, a base bias current I30, flowing through a collector-emitter of the third transistor Q30 is decreased. Accordingly, the collector-emitter current I40, flowing through the amplifying transistor Q40, is decreased, and ultimately the collector-emitter current I40, flowing through the amplifying transistor Q40 is compensated.

As described above, the bias circuit according to an example is connected to both sides based on a base of a first transistor, and a simple compensation circuit, including two resistors having different thermal coefficients, is used. In this regard, when the ambient temperature changes or is changed, a current of a second current path, in which a second transistor is included, is constant, but a current of a first current path, in which a first transistor is included, may be controlled by controlling a base current of the first transistor.

Accordingly, a base bias current becomes controllable, and the base current is controlled to control the base bias current. As a result, it may become more advantageous to accurately perform a temperature compensation function.

Moreover, in a bias circuit, when a first transistor located in a region, in which heat is the most severely generated, a second resistor and a third resistor may also be more sensitive to changes in temperature characteristics, so that more efficient temperature compensation may be achieved.

As set forth above, according to an embodiment in the present disclosure, temperature compensation may be performed, on a portion in which gain is changed according to a change in temperatures while an amplifier circuit (for example, a power amplifier integrated circuit (PAIC) may be operated, gain flatness of the amplifier circuit may be improved, and thus an improved error vector magnitude (EVM) function may be secured.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bias circuit, comprising:
a bias current circuit including a first resistor and a first transistor, in a first current path connected between a current terminal of a reference current and a ground, and connected to each other in series, and a second transistor in a second current path connected between the current terminal and the ground, and having a base connected to a collector of the first transistor;
a temperature compensation circuit including a second resistor in the second current path, and connected between an emitter of the second transistor and a base of the first transistor and having a first thermal coefficient, and a third resistor included in the second current path, and connected between the base of the first transistor and the ground and having a second thermal coefficient, different from the first thermal coefficient; and
a bias output circuit including a third transistor having a base connected to the base of the second transistor.

2. A bias circuit, comprising:
a bias current circuit including a first resistor and a first transistor, in a first current path connected between a current terminal of a reference current and a ground, and connected to each other in series, and a second transistor in a second current path connected between the current terminal and the ground, and having a base connected to a collector of the first transistor;
a temperature compensation circuit including a second resistor in the second current path, and connected between an emitter of the second transistor and a base of the first transistor and having a first thermal coefficient, and a third resistor included in the second current path, and connected between the base of the first transistor and the ground and having a second thermal coefficient, different from the first thermal coefficient;
a bias output circuit having a third transistor connected between a power supply voltage terminal and a base node of an amplifier circuit, and having a base connected to the base of the second transistor.

3. The bias circuit of claim 2, wherein the first resistor has a zero thermal coefficient, and
the first thermal coefficient is a negative thermal coefficient.

4. The bias circuit of claim 3, wherein the second thermal coefficient is a positive thermal coefficient.

5. The bias circuit of claim 2, wherein the first resistor has a zero thermal coefficient,
the first thermal coefficient is a negative thermal coefficient, and
the second thermal coefficient is a positive thermal coefficient.

6. The bias circuit of claim 2, wherein upon an ambient temperature rising, a resistance value of the third resistor increases and a base current of the first transistor increases.

7. The bias circuit of claim 2, wherein upon an ambient temperature rising, a resistance value of the third resistor increases, a base current of the first transistor increases, and a resistance value of the second resistor decreases.

8. The bias circuit of claim 7, wherein the first transistor increases a collector-emitter current of the first transistor based on an increase in the base current of the first transistor, to reduce a base current of the third transistor, and to reduce a base bias current, a collector-emitter current of the third transistor.

9. An amplifying device, comprising:
a bias circuit configured to supply a base bias voltage; and
an amplifier circuit configured to receive the base bias voltage, the bias circuit including:
a bias current circuit including a first resistor and a first transistor, in a first current path connected between a current terminal of a reference current and a ground, and connected to each other in series, and a second transistor in a second current path connected between the current terminal and the ground, and having a base connected to a collector of the first transistor;
a temperature compensation circuit including a second resistor in the second current path, and connected between an emitter of the second transistor and the base of the first transistor and having a first thermal coefficient, and a third resistor included in the second current path, connected between the base of the first transistor and the ground and having a second thermal coefficient, different from the first thermal coefficient; and
a bias output circuit having a third transistor connected to a base connected to the base of the second transistor.

10. The amplifying device of claim 9, wherein
the third transistor is connected between a power supply voltage terminal and a base node of an amplifier circuit.

11. The amplifying device of claim 10, wherein the first resistor has a zero thermal coefficient, and
the first thermal coefficient is a negative thermal coefficient.

12. The amplifying device of claim 11, wherein the second thermal coefficient is a positive thermal coefficient.

13. The bias circuit of claim 10, wherein the first resistor has a zero thermal coefficient,
the first thermal coefficient is a negative thermal coefficient, and
the second thermal coefficient is a positive thermal coefficient.

14. The amplifying device of claim 10, wherein upon an ambient temperature rising, a resistance value of the third resistor increases and a base current of the first transistor increases.

15. The amplifying device of claim 10, wherein upon an ambient temperature rising, a resistance value of the third resistor increases, a base current of the first transistor increases, and a resistance value of the second resistor decreases.

16. The amplifying device of claim 15, wherein the first transistor increases a collector-emitter current of the first transistor based on an increase in the base current of the first transistor, to reduce a base current of the third transistor, and to reduce a base bias current, a collector-emitter current of the third transistor.

17. The bias circuit of claim 1, wherein the third transistor is connected between a power supply voltage terminal and a base node of an amplifier circuit.

* * * * *